TUNER FOR HIGH FREQUENCY ELECTRON DISCHARGE DEVICES

Filed March 29, 1957

INVENTOR:
Paul W. Crapuchettes

By Robert H. Lentz

Attorney

United States Patent Office 2,967,261

Patented Jan. 3, 1961

2,967,261

TUNER FOR HIGH FREQUENCY ELECTRON DISCHARGE DEVICES

Paul W. Crapuchettes, Atherton, Calif., assignor to Litton Industries of California, Beverly Hills, Calif.

Filed Mar. 29, 1957, Ser. No. 649,442

3 Claims. (Cl. 315—5.53)

Figures 1, 2:
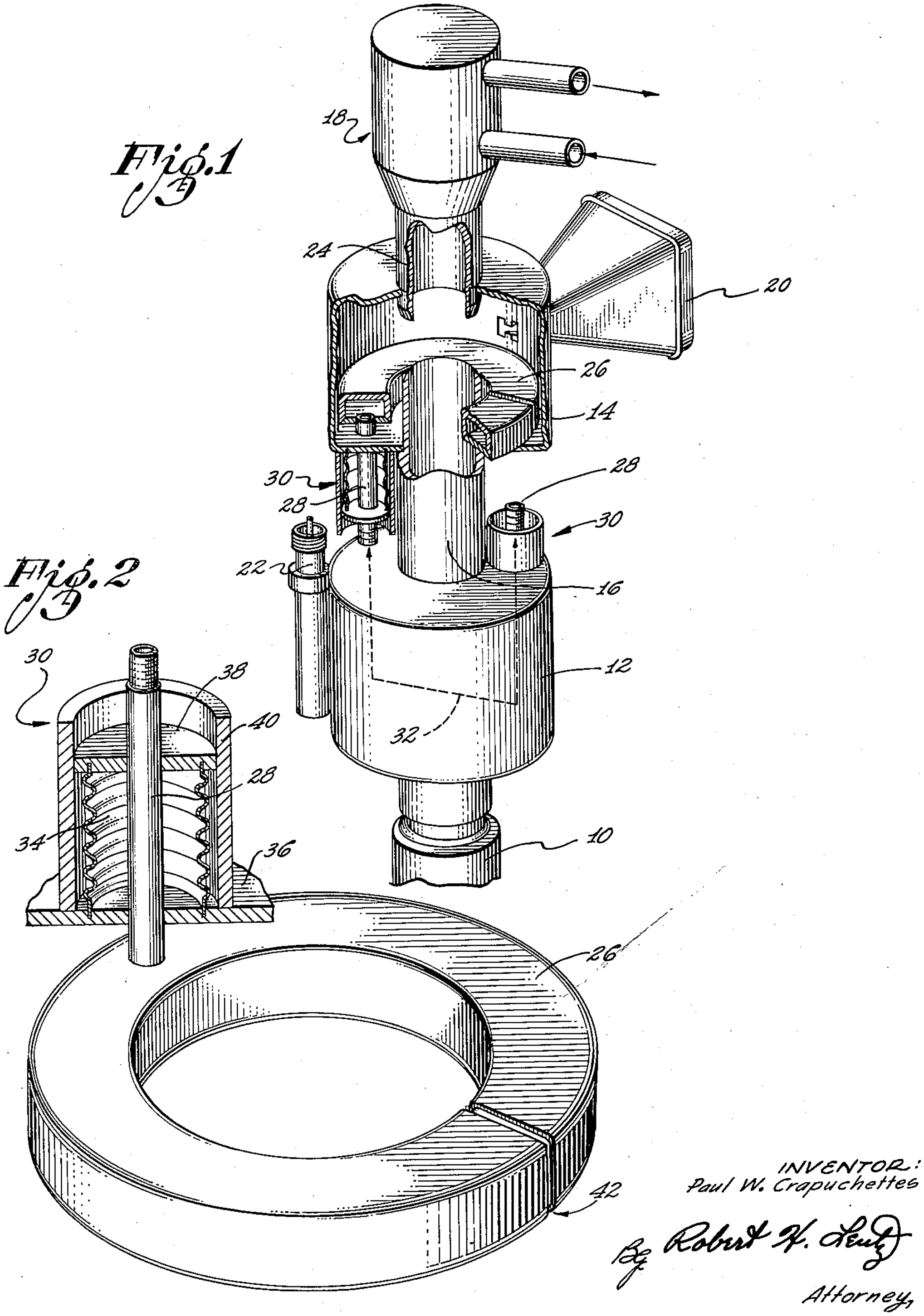

This invention relates to a tuner for high frequency electron discharge devices, and more particularly to a split ring tuner for tuning klystron cavity resonators.

In the prior art numerous mechanical devices have been developed for tuning the cavity resonators of klystrons, the most successful of which have functioned to tune the cavity resonators substantially symmetrically about the drift tube axis. Among the tuning mechanisms which fall within this classification are diaphragm tuners which function to vary the internal volume of the cavity by deflection of a diaphragm which constitutes one end of the cavity, and ring tuners wherein an annular conducting member is positioned concentrically inside the cavity resonator and is moved axially to vary the reactive parameters of the cavity. This latter form of tuning mechanism has been found especially suitable for use in multi-cavity high power klystron amplifiers, such as those employed as the transmitting tubes in high power radars.

Although ring tuners have been found to perform reasonably well in many application, there are still several serious disadvantages attendant their use. Firstly, the output signal often exhibits undesired harmonics of the fundamental frequency in its spectrum. Secondly, it is not unusual to encounter what may be termed a "crossed frequency" phenomenon where the frequency versus tuning position curve for the fundamental mode is crossed within the tuning range by a second curve representing an undesired mode of resonance; when this phenomenon is encountered, therefore, there are two possible frequencies of oscillation, both within the tuning range, for any given position of the tuning ring. In addition to the foregoing problems, oscillations in the higher order modes also occasionally cause tube failure due to arcing from the tuning ring to the adjacent cavity wall. In fact in practice it has been found that the tuning ring actually may be melted by heat created by currents induced therein by higher mode oscillations.

In accordance with the present invention it has been discovered that the foregoing and other disadvantages of the prior art tuning rings may be overcome by utilizing in lieu thereof a discontinuous tuning ring, or stated differently, a tuning ring which has been split to form an open toroid rather than a closed toroid. Utilization of a split ring tuner, as taught by the present invention, has been found to substantially eliminate higher harmonics from the output signal spectrum, to avoid the "crossed frequency" phenomenon, to suppress those higher order modes which formerly relied upon circulating currents induced in the tuning ring for their existence, and in addition, to increase circuit efficiency by the elimination of the losses created by these spurious currents.

It is also a feature of the invention to provide a tuning mechanism which is ideally suited to gang tuning of multi-cavity klystrons inasmuch as the suppression and/or separation of modes of oscillation other than the fundamental mode greatly facilitates production and adjustment of tunable multi-cavity klystrons. Moreover, as will be disclosed in more detail hereinbelow, the advantages derived thorugh the utilization of the split-ring tuning elements of the invention are obtained without materially changing the tuning characteristic of the cavities in their fundamental mode of oscillation.

It is, therefore, an object of the invention to provide a klystron tuning element which also functions as a suppressor and/or separator of higher order modes.

Another object of the invention is to provide a mechanical tuning element for symmetrically tuning klystron cavity resonators while simultaneously suppressing higher order modes of oscillation.

It is a further object of the invention to provide a split-ring tuning element for klystron cavity resonators whereby tuning in the fundamental mode is readily accomplished while oscillations in modes requiring circulating currents in the tuning ring are suppressed.

It is still another object of the invention to provide a tuning element which is ideally suited to the gang tuning of the cavity resonators of a multi-cavity klystron.

The novel features which are believed to be characteristic of the invention, both as to its organization and method of operation, together with further objects and advantages thereof, will be better understood from the following description considered in connection with the accompanying drawings in which one embodiment of the invention is illustrated by way of example. It is to be expressly understood, however, that the drawings are for the purpose of illustration and description only, and are not intended as a definition of the limits of the invention.

Fig. 1 is a perspective view, partly in section, of a multi-cavity klystron employing split-ring tuning elements, in accordance with the invention; and Fig. 2 is a perspective view of a split-ring tuning element illustrating in detail one method in which it may be mounted for movement within a cavity resonator.

With reference now to the drawing, wherein like or corresponding parts are designated by the same reference characters throughout the several views, there is shown in Fig. 1 a multi-cavity klystron which utilizes the novel tuning element of the invention. Basically the klystron shown in Fig. 1 includes an electron gun 10, only a portion of which is shown, an input or buncher cavity resonator 12 connected to the electron gun structure, an output cavity resonator 14 coupled to input cavity 12 by a drift tube 16, a collector assembly, generally designated 18 which is interconnected with output cavity 14, and a tuning structure for varying the reactance of the cavity resonators to thereby tune the klystron over the particular frequency range of interest.

In operation the klystron functions in the well-known manner to present an amplified output signal at an output window, not shown, in an output coupler 20 which is coupled to resonator 14. More specifically, electron gun 10 is operable to project an electron beam through input resonator 12, drift tube 16, output resonator 14 and into collector 18, the electrons in the beam being velocity modulated as they pass through the input cavity resonator by an electrical input signal applied to a coaxial input conductor 22 whose inner conductor terminates within the input cavity resonator. The velocity modulated electrons are thus bunched as they pass through the drift tube and deliver energy to the output cavity resonator as they pass through the gap between the drift tube and a collector tube 24 which forms part of the collector assembly. The electrons thereafter continue on through collector tube 24 into the main body of the collector where they are collected or absorbed, a suitable cooling mechanism, such as a coater jacket, being provided to dissipate heat generated within the collector.

Referring now with particularity to the tuning structure of the invention as shown in the klystron of Fig. 1, each of the cavity resonators has associated therewith an annular conductive tuning element having a gap therein, as illustrated by the open toroidal ring 26 in output resonator 14, a mounting post 28 for mounting the associated ring within the cavity concentric with the exterior walls thereof and with the electron beam channeling tubes, and means for enabling axial movement of each tuning ring within the cavity, this latter structure taking the form of a sylphon bellows unit, generally designated 30, in Fig. 1. In addition to the foregoing elements the tuning structure may also include any suitable gang tuning mechanism for moving the tuning rings within the several resonators in unison, such as the mechanism shown in copending U. S. patent application Serial No. 418,303, filed March 24, 1954, now U. S. Patent No. 2,853,647, issued Sept. 23, 1958, for "Cavity Resonator Electron Discharge Device" by Charles V. Litton. Inasmuch as the invention is not restricted to any particular form of gang tuning structure, the structure is merely shown schematically in Fig. 1 by the dotted line 32.

With reference now to Fig. 2, the various elements of the tuning mechanism for a single cavity are shown in detail. As illustrated in Fig. 2, sylphon bellows unit 30 comprises a bellows 34 which is hermetically sealed at one end to the resonator wall 36 and at its other end to a metal washer 38, the washer in turn being brazed or otherwise affixed to the tuner mounting post 28. The bellows unit is completed by a cylinder 40 which is affixed to the resonator wall 36, to provide a guide channel for washer 38.

As viewed in Fig. 2, tuning ring 26 is in turn affixed to the lower end of mounting post 28, as by brazing for example, and is cut or slotted at a point 42, in accordance with the invention. The tuning ring may of course be either hollow or solid, and is preferably fabricated of copper or a high conductivity copper alloy in order to maintain the Q of the cavity as high as possible. In fabricating the tuning ring it has been found preferable to first produce a closed toroid, and then to cut the toroid to provide the necessary gap therein.

Consider now the dimensions of the gap in the toroid and its location with respect to the mounting post which suspends the tuning ring within the cavity. It will be appreciated that the gap should be sufficiently large to prevent arcing between the adjacent ends of the tuning ring, yet should be kept small enough to provide symmetrical tuning of the resonator without distortion. In practice, for example, tuning rings having gaps of the order of one eighth of an inch in width have functioned satisfactorily without arcing and without materially varying the tuning curve of the fundamental mode. In general, the point at which the gap in the tuning ring is located is not critical so long as care is exercised to see that the two ends of the split-ring do not present a circuit which resonates at a frequency within the range over which the cavity resonator is to tune.

Recalling now that the dominant mode of oscillation in the symmetrical cavity resonators of klystrons is the T.M. mode of longest wavelength, it will be recognized that for this mode the magnetic field circulates within the resonator and is substantially parallel with the split-ring tuning element of the invention. Consequently, the currents induced in the tuning element, by virtue of its operation in conjunction with the adjacent walls of the resonator, will flow across the tuning element, or in other words, will flow primarily in a radial manner with respect to the geometric center of the ring. It will be seen therefore, that the gap in the tuning ring will have no appreciable effect upon the operation of the resonator in its dominant mode of oscillation.

However, with respect to other modes of oscillation which tend to establish magnetic flux lines perpendicular to the split-ring element of the invention, the gap in the tuning ring prevents circulating currents from being induced therein and therefore effectively suppresses these undesired modes. Moreover, it has been found that the novel tuning element of the invention also eliminates higher order harmonics from the output signal spectrum, and in at least one particular application has been found to eliminate the previously described crossed frequency phenomenon which had theretofore been encountered in the tuning range of a high power multi-cavity klystron.

It is to be understood, of course, that alterations and modifications may be made in the structures herein shown without departing from the spirit and scope of the invention. For example, although the split-ring tuning element of the invention is shown in Fig. 1 to be positioned in an evacuated cavity resonator, it is clear that the identical concepts are equally applicable for use with klystrons wherein the cavity resonators are not evacuated but are instead externally coupled to the exhausted portion of the tube through suitable windows. It should be emphasized, therefore, that the spirit and scope of the invention is to be limited only by the spirit and scope of the appended claims.

What is claimed as new is:

1. In a velocity modulated vacuum tube, the combination comprising: a cavity resonator having first and second apertured ends; a first electron beam channeling tube extending into said cavity resonator through the aperture in said first end, said first tube being concentrically positioned with respect to said resonator and being connected thereto at said first end; a second electron beam channeling tube extending into said cavity resonator through the aperture in said second end, said second tube being concentrically positioned with respect to said resonator and said first tube and being connected to said resonator at said second end; an annular tuning element having a gap completely therethrough at a predetermined point in its circumference; first means for mounting said tuning element in said cavity concentric with said first and second beam channeling tubes; and second means for selectively moving said tuning element axially within said cavity.

2. The combination defined in claim 1 wherein said first means comprises a metallic post passing through said resonator at one of said ends and affixed to said annular tuning element at a point diametrically opposite said gap in said tuning element.

3. A klystron amplifier comprising: a plurality of annular cavity resonators mounted in axially aligned position, each of said resonators having an outer tubular wall, end walls connected to said outer wall, and an inner tubular wall coaxial with said outer wall and provided with a gap intermediate said end walls, said end walls having openings communicating with the tube formed by said inner wall; an electron beam source mounted at one end of said axially aligned resonators for directing an electron beam axially through said openings for coaction with said resonators through said gaps; a tuning means for each of said resonators comprising a toroidal plunger moveably mounted within the corresponding resonator between said outer wall and said inner wall for movement between one of said end wall and said gap, each of said toroidal plungers being positioned concentrically with respect to its associated cavity resonator and being discontinuous radially at a predetermined point in its circumference to suppress oscillation in modes other than the fundamental T.M. mode of the associated resonator;

and means mounted externally of said resonators for axially moving said plungers within said cavity resonators.

References Cited in the file of this patent

UNITED STATES PATENTS

| | | |
|---|---|---|
| 2,431,103 | Bradley et al. | Nov. 18, 1947 |
| 2,432,571 | Haeff | Dec. 16, 1947 |
| 2,468,145 | Varian | Apr. 26, 1949 |
| 2,500,417 | Kinzer | Mar. 14, 1950 |
| 2,552,040 | Haeff | May 8, 1951 |
| 2,593,095 | Brehm | Apr. 15, 1952 |
| 2,593,234 | Wilson | Apr. 15, 1952 |
| 2,651,738 | Ebers | Sept. 8, 1953 |
| 2,704,338 | Clampitt et al. | Mar. 15, 1955 |
| 2,752,524 | Martin | June 26, 1956 |
| 2,822,501 | Poulter | Feb. 4, 1958 |
| 2,853,647 | Litton | Sept. 23, 1958 |

FOREIGN PATENTS

| | | |
|---|---|---|
| 727,742 | Great Britain | Apr. 6, 1955 |